(12) United States Patent
Miller et al.

(10) Patent No.: US 6,777,937 B1
(45) Date of Patent: Aug. 17, 2004

(54) NUCLEAR QUADRUPOLE RESONANCE METHOD AND APPARATUS

(75) Inventors: Joel Miller, Cheverly, MD (US); Allen Garroway, Fort Washington, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/384,922

(22) Filed: Mar. 6, 2003

(51) Int. Cl.$^7$ ................................................ G01V 3/00
(52) U.S. Cl. ...................................... 324/318; 324/322
(58) Field of Search ............................... 324/318, 322, 324/307, 309, 312, 314, 300

(56) References Cited

U.S. PATENT DOCUMENTS

| | | |
|---|---|---|
| 5,206,592 A | 4/1993 | Buess et al. |
| 5,233,300 A | 8/1993 | Buess et al. |
| 5,365,171 A | 11/1994 | Buess et al. |
| 5,457,385 A * | 10/1995 | Sydney et al. .............. 324/301 |
| 5,608,321 A | 3/1997 | Garroway et al. |
| 5,682,098 A | 10/1997 | Vij |
| 5,804,967 A | 9/1998 | Miller et al. |
| 6,054,856 A | 4/2000 | Garroway et al. |
| 6,104,190 A | 8/2000 | Buess et al. |
| 6,150,816 A | 11/2000 | Srinivasan |
| 6,242,918 B1 | 6/2001 | Miller et al. |
| 6,411,208 B1 | 6/2002 | Buess et al. |
| 6,420,872 B1 | 7/2002 | Garroway et al. |
| 6,522,135 B2 | 2/2003 | Miller et al. |

OTHER PUBLICATIONS

Patent Application No. 10/183,351, Three Frequency Nuclear Quadrupole Resonance (NQR), filed Jun. 28, 2002.
Hayes et., An Efficient, Highly Homogeneous Radiofrequency Coil for Whole–Body NMR Imaging at 1.5 T, J. Magnetic Resonance, 63, pp. 622–628 (1985).
Watkins et al, High–Pass Bird–Cage Coil For Nuclear–Magnetic Resonance, Rev. Sci. Instrum. vol 59, No. 6, Jun. 1988, pp. 926–929.

Stensgaard, Planar Quadrature Coil Design Using Shielded–Loop Resonators, J. Magnetic Resonance, 125, pp. 84–91 (1997).

* cited by examiner

Primary Examiner—Louis Arana
(74) Attorney, Agent, or Firm—John J. Karasek; L. George Legg

(57) ABSTRACT

An NQR apparatus for irradiating a sample with an RF magnetic field and for determining the presence of a target material by detecting an NQR signal includes a transmitter for generating an output signal at a selected frequency, a receiver for detecting the NQR signal, a probe, and a switch coupling the receiver and the transmitter with the probe for alternately connecting and disconnecting the receiver and the transmitter to the probe, thereby switching the NQR apparatus between a transmitting mode and a receiving mode. The probe consists of a resonant circuit that includes a coil array. The coil array includes a first figure-8 coil and a partially overlapping, second figure-8 coil for generating an RF magnetic field in a detecting region outside the probe. The first and second coils together alternate between a transmitting mode for irradiating a sample in the detecting region with an RF magnetic field, and a receiving mode for detecting an NQR signal indicative of the presence of a target material in the sample. The coil array produces a highly uniform rotating RF magnetic field, increasing its detection sensitivity and enhancing its ability to separate magnetic resonance signals from piezoelectric and acoustic ringing.

16 Claims, 6 Drawing Sheets

NUCLEAR QUADRUPOLE RESONANCE METHOD AND APPARATUS

TECHNICAL FIELD

The present invention relates to a nuclear quadrupole resonance (NQR) method and device for detecting a target material using a rotating radio frequency (RF) magnetic field. More particularly, the present invention is directed to an improved NQR surface coil design and method for generating a rotating RF field in a detecting region outside the surface coil.

BACKGROUND ART

There are many situations where it is desirable to detect the presence of a target material, that is, a specific substance. For example, detection systems are often used to detect sub-kilogram quantities of narcotics and explosives against a background of more benign materials. Such detection systems are used in airports and other locales to detect these materials, e.g. when hidden in luggage.

NQR is a known technique for detecting a target material. It is an effective means of detecting nitrogenous and chlorine-containing materials, such as explosives and narcotics, owing to the presence of quadrupolar nuclei, e.g. $^{14}$N and $^{35,37}$Cl, in these substances. This general NQR approach is referred to as 'pure' NQR to indicate that no externally applied static magnetic field is required. NQR is generally excited with an RF pulse that induces an NQR signal known as a free induction decay (FID). Trains of pulses induce NQR signals known as spin echoes, related to FIDs. An RF pulse at a specific frequency transmitted to a coil in proximity to a sample of interest induces an NQR signal from the nuclear spins of quadrupole nuclei in these specific materials but not in others. The NQR signal is generally proportional to the quantity of material excited, but the exact magnitude of the NQR signal depends on the relative orientation of the RF field and the molecules of the sample. The direction of the RF field with respect to the sample is, in turn, determined by the geometry of the RF field and the position of the sample relative to the coil.

FIG. 1 is a diagram illustrating a conventional NQR apparatus. A transmitter 20 and a receiver 22 are connected to a probe 24 through a transmit/receive (T/R) switch 26. Probe 24 includes an inductor, such as a solenoid coil 28, forming part of a resonance circuit with other inductors L and capacitors C. To detect the presence of a target material, T/R switch 26 connects transmitter 20 to probe 24 while disconnecting receiver 22 from probe 24. Transmitter 20 then generates and transmits a pulse to probe 24. The pulse is typically formed by an RF signal having a frequency corresponding to the resultant resonance signal of the nuclei of the target material to be detected. Probe 24 receives the pulse, causing coil 28 to store (RF) energy, which in turn produces a corresponding RF magnetic field. When a sample (not illustrated) is positioned near, or inside, coil 28, the RF magnetic field irradiates the sample inducing an NQR signal in a target material.

After subjecting the sample to the RF magnetic field, T/R switch 26 connects receiver 22 to probe 24 while disconnecting transmitter 20 from probe 24. Coil 28 then detects NQR induced in a target material and probe 24 produces a corresponding output signal. The output signal is received and analyzed by receiver 22, thereby establishing the presence of a target material in the sample.

In real world use of NQR for detecting narcotics and explosives, a sample may or may not contain the target material of interest. Due to the selection of a narrow bandwidth of the RF magnetic field for irradiating a sample and because of the large range of NQR frequencies in benign, non-targeted materials, it is unlikely that an NQR signal is induced in such non-targeted materials by the RF magnetic field. Accordingly, an NQR device provides accurate identification of target materials without producing false alarms (false positives).

Unfortunately, a major obstacle to detecting sub-kilogram quantities of these types of materials is the low sensitivity of NQR detection devices. One approach to this problem employs spatially rotating RF magnetic fields generated by two spatially orthogonal RF magnetic fields 90° out of phase. In the related fields of nuclear magnetic resonance (NMR) and magnetic resonance imaging (MRI), the use of rotating RF magnetic fields can increase the detected maximum signal by a factor of 2, with a concomitant increase in the signal-to-noise ratio (SNR) of 1.4.

A similar increase in SNR can be obtained for NQR, but for very different physical reasons. For the typical case of a powdered or polycrystalline sample the NQR signal is independent of the direction of the RF field, however only a fraction of the nuclei are excited by the pulse. As described in U.S. Ser. No. 08/904,937, filed Aug. 1, 1997, and incorporated herein by reference, a rotating RF magnetic field can increase the number of nuclei excited by the RF pulse. The detected maximum signal from single pulse excitation increases by a factor of almost 2, with a concomitant increase in the SNR of approximately 1.2. The SNR gain is about 1.4 for spin echo sequences. Also, smaller pulse flip angles may be used to excite the spins, with a corresponding savings in RF transmitter power. Also as set forth in U.S. Ser. No. 08/904,937, the use of rotating RF magnetic fields in NQR can make the detector less sensitive to acoustic and piezoelectric ringing artifacts.

FIG. 2 is a diagram illustrating another NQR apparatus for applying and detecting rotating RF magnetic fields. It operates in a manner similar to the conventional NQR apparatus shown in FIG. 1. A transmitter 30 and a receiver 32 are connected to a probe 34 through T/R switch 36. Probe 34 includes a coil 38, such as a birdcage coil for generating and detecting rotating RF magnetic fields. Transmitter 30 differs from its conventional counterpart 20 in that it provides two RF signals 90° out of phase to create the rotating RF magnetic field. Likewise, receiver 32 detects both components of the rotating NQR signal and T/R switch 36 can connect the two transmitter outputs and two receiver inputs to probe 34.

One implementation of a device capable of generating the rotating RF field inside the enclosed coil volume employs what is commonly referred to as a "birdcage" coil geometry. However, some scenarios require a device for excitation and detection outside the coil volume. There are two criteria for such a device: i) the device must generate the two RF magnetic field components substantially orthogonal to each other; and ii) if multiple coils are used, they must have negligible mutual inductance. U.S. Pat. No. 5,682,098 describes such an MRI device that employs overlapping surface coils for this purpose. "Planar quadrature coil design using shielded-loop resonators", *J. Magnetic Resonance*, Vol. 125, pp. 84–91, A. Stensgaard (1997), describes another MRI device using a 'dual mode' single surface coil for rotating field detection. Such designs work well in MRI where the nuclei are insensitive to RF fields in the direction of the polarizing static magnetic field, i.e. where the RF magnetic fields need only be orthogonal in two dimensions. However in NQR, parallel RF magnetic field components introduce a non-rotating field component that reduces the SNR improvement.

FIG. 3 illustrates a conventional surface coil array 40 for applying and detecting rotating RF magnetic fields that can be used in an NQR device, e.g. such as the one shown in FIG. 2. Coil array 40 includes a first coil 48 that is coplanar and co-centered (i.e. fully overlapping) with a second coil 49. More particularly, coils 48 and 49 as shown are what are commonly referred to as figure-8 coils, based on the geometrical shape and appearance. A "figure-8" coil is understood to include any coil consisting of two coplanar sections enclosing an area. The sections are configured such that an external uniform RF magnetic field induces equal but opposite currents in the sections, the figure-8 coil thus performing like a receiving gradiometer. (By reciprocity, a coil may be considered to be either a transmitting or receiving coil.) The sections can therefore assume any geometric shape capable of this function and if desired can be spaced apart at a distance suitable for the particular application. Coils 48 and 49 are rotated 90° with respect to one another, and with surface coil array 40 substituted for the birdcage coil 38 of probe 34, as switch 36 connects transmitter 30 to probe 34, coils 48 and 49 produce a magnetic field projecting orthogonal to their plane and thereby outside of probe 34. The combination of full overlap and 90° rotation of the coils minimizes their mutual inductance so that the coils operate independently of each other. FIG. 4 shows that the RF magnetic fields generated by the coils 48 and 49 have significant parallel (or antiparallel) components perpendicular to the plane of the coils. For NMR applications these field components can be arranged along the static magnetic field direction where they do not contribute to the excitation or detection of the FID.

It would be desirable to provide an improved NQR apparatus having an increased sensitivity for detecting sub-kilogram amounts of target materials, and decreased sensitivity to acoustic and piezoelectric ringing, that is also capable of generating rotating RF fields outside the NQR device in order to expand the possible applications of its use.

DISCLOSURE OF THE INVENTION

According to the invention, an NQR apparatus for irradiating a sample with an RF magnetic field and for determining the presence of a target material by detecting an NQR signal includes a transmitter for generating an output signal at a selected frequency, a receiver for detecting the NQR signal, a probe, and a switch coupling the receiver and the transmitter with the probe for alternately connecting and disconnecting the receiver and the transmitter to the probe, thereby switching the NQR apparatus between a transmitting mode and a receiving mode. The probe consists of a resonant circuit that includes a coil array. The coil array includes a first figure-8 coil and a partially overlapping, second figure-8 coil for generating an RF magnetic field in a detecting region outside the probe. The first and second coils together alternate between a transmitting mode for irradiating a sample in the detecting region with an RF magnetic field, and a receiving mode for detecting an NQR signal indicative of the presence of a target material in the sample.

The invention also includes the method of using this apparatus whereby a sample is positioned within the detecting region outside the probe to detect an NQR signal indicating the presence of a quadrupole nuclei-containing target material in the sample.

The coil array disclosed here produces a more uniform rotating RF magnetic field than previous coil arrays. Increasing the uniformity of the rotating RF magnetic field increases the detection sensitivity and enhances the ability to separate magnetic resonance signals from piezoelectric and acoustic ringing. The coil array has applications in NQR detection of explosives and contraband, particularly landmine detection, personnel screening, and handheld screening of packages, baggage, and vehicles. The coil array may also find applications in magnetic resonance imaging.

Additional features and advantages of the present invention will be set forth in, or be apparent from, the detailed description of preferred embodiments which follows.

PREFERRED EMBODIMENTS OF THE INVENTION

Figure 5:
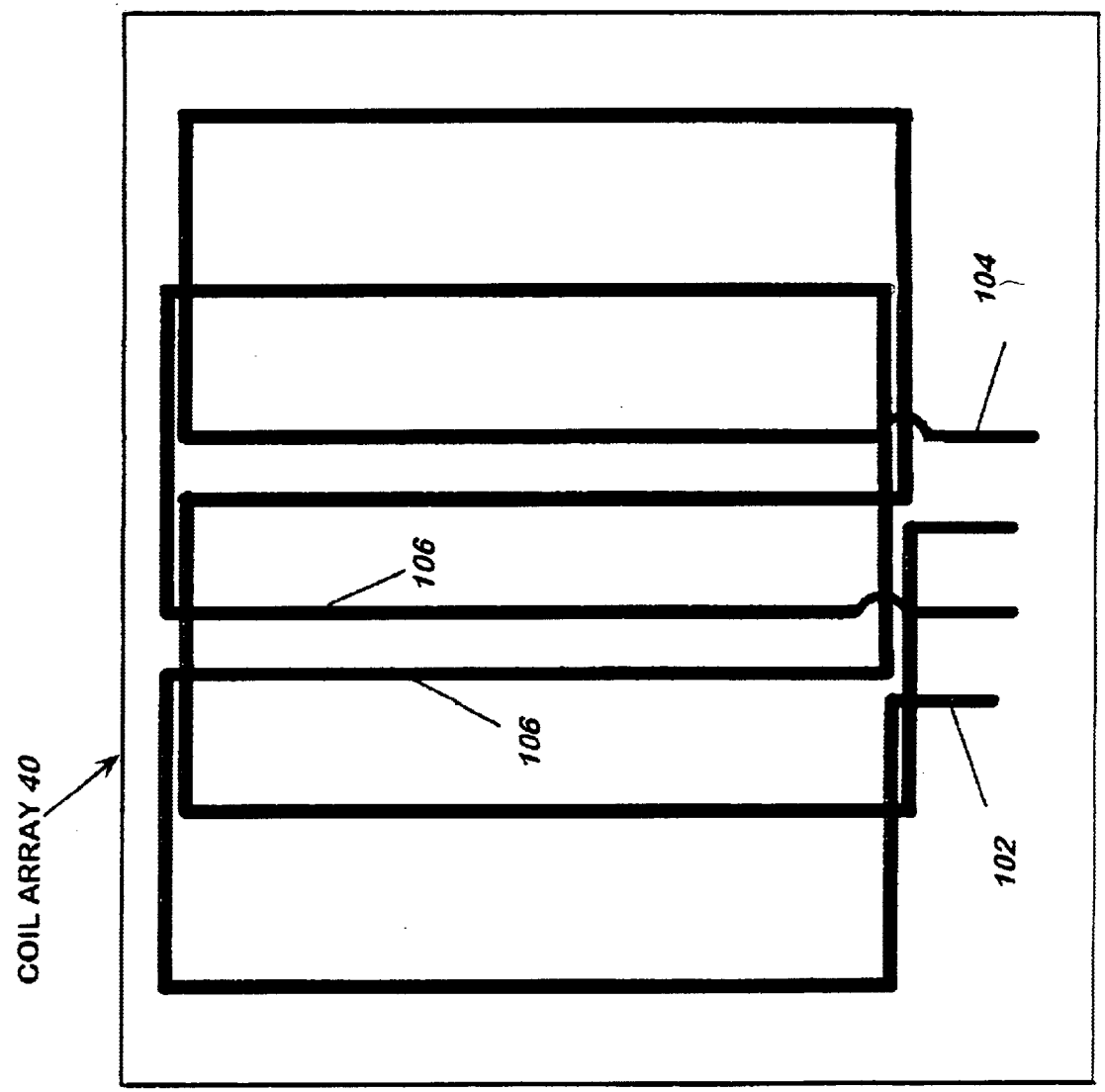
FIG. 5 is a schematic of an improved surface coil array according to the invention.

The invention provides a two-coil array wherein the RF magnetic fields generated by the two coils are substantially orthogonal with low mutual inductance between the coils. In a conducting loop, whether circular or rectangular, the RF magnetic field in a plane parallel to the plane of the coil and directly above the conductor is orthogonal to the field in that plane directly above the center of the loop. With reference to FIG. 5, a surface coil array 100 according to the invention includes a first figure-8 coil 102 positioned coplanar with and offset from a second figure-8 coil 104. Unlike the surface coil array 40 described above, coils 102 and 104 are parallel and not co-centered, that is, they partially and not entirely overlap one another. The central conductors 106 of figure-8 coil 102 are preferably located near the center of one of the loops 108 of the other figure-8 coil 104.

For parallel, coplanar figure-8 coils offset from each other as are coils 102 and 104 in coil array 100, there are two offset positions where the coils' mutual inductance is minimized. One is with a coil overlap of about 10%, the other with an overlap of about 68%. The latter offset, depicted in FIG. 5, results in good orthogonality between the coils' RF magnetic fields. It will be appreciated that the exact offset depends somewhat on the coil geometry and construction. Although coils 102 and 104 are shown parallel to one another, the invention also includes configurations in which the coils are rotated up to about 30 degrees with respect to each other with a corresponding decrease in the amount of overlap necessary for minimizing the coils' mutual inductance in the given configuration.

Figure 1:
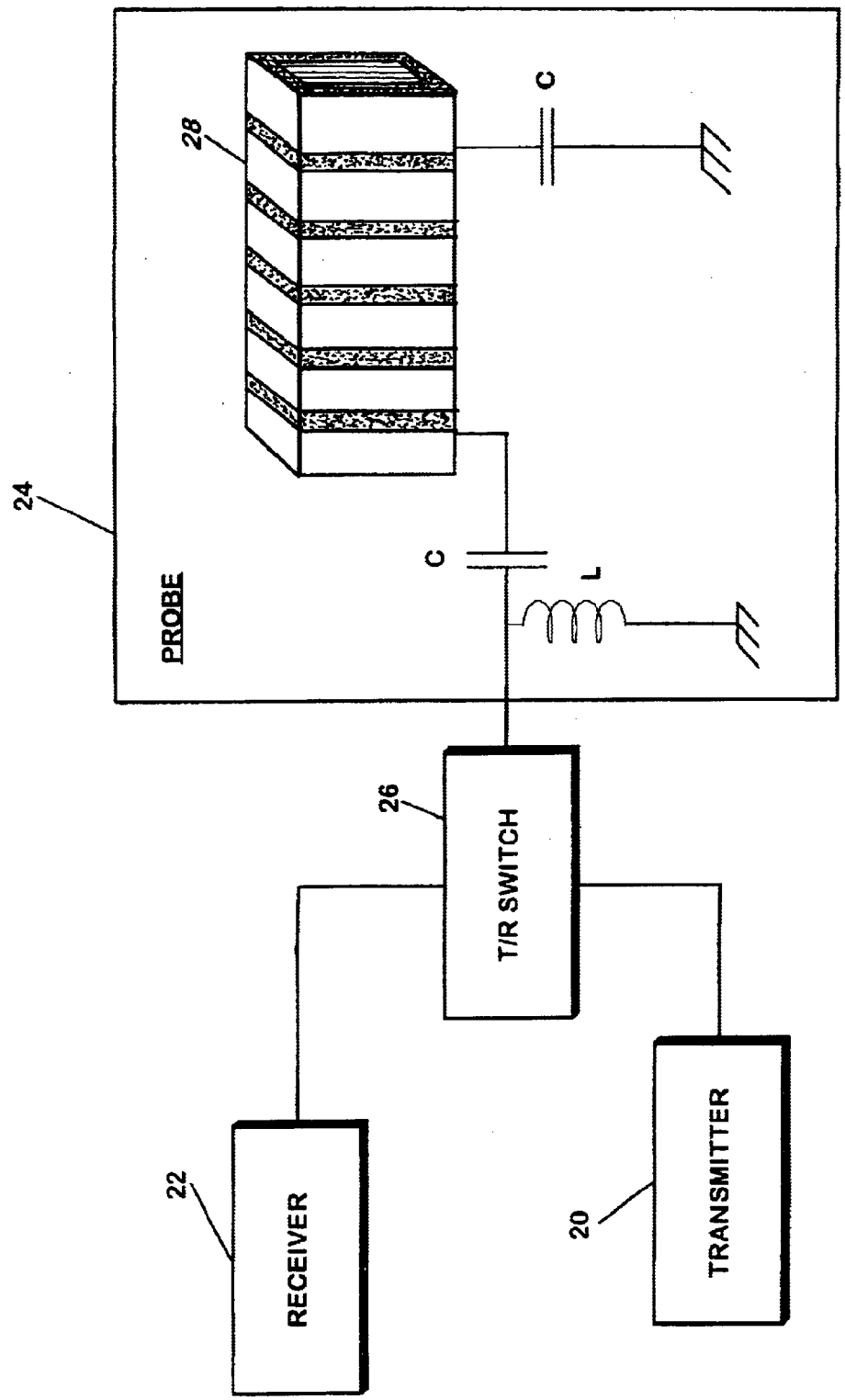
FIG. 1 is a schematic of a conventional NQR apparatus.
Figure 2:
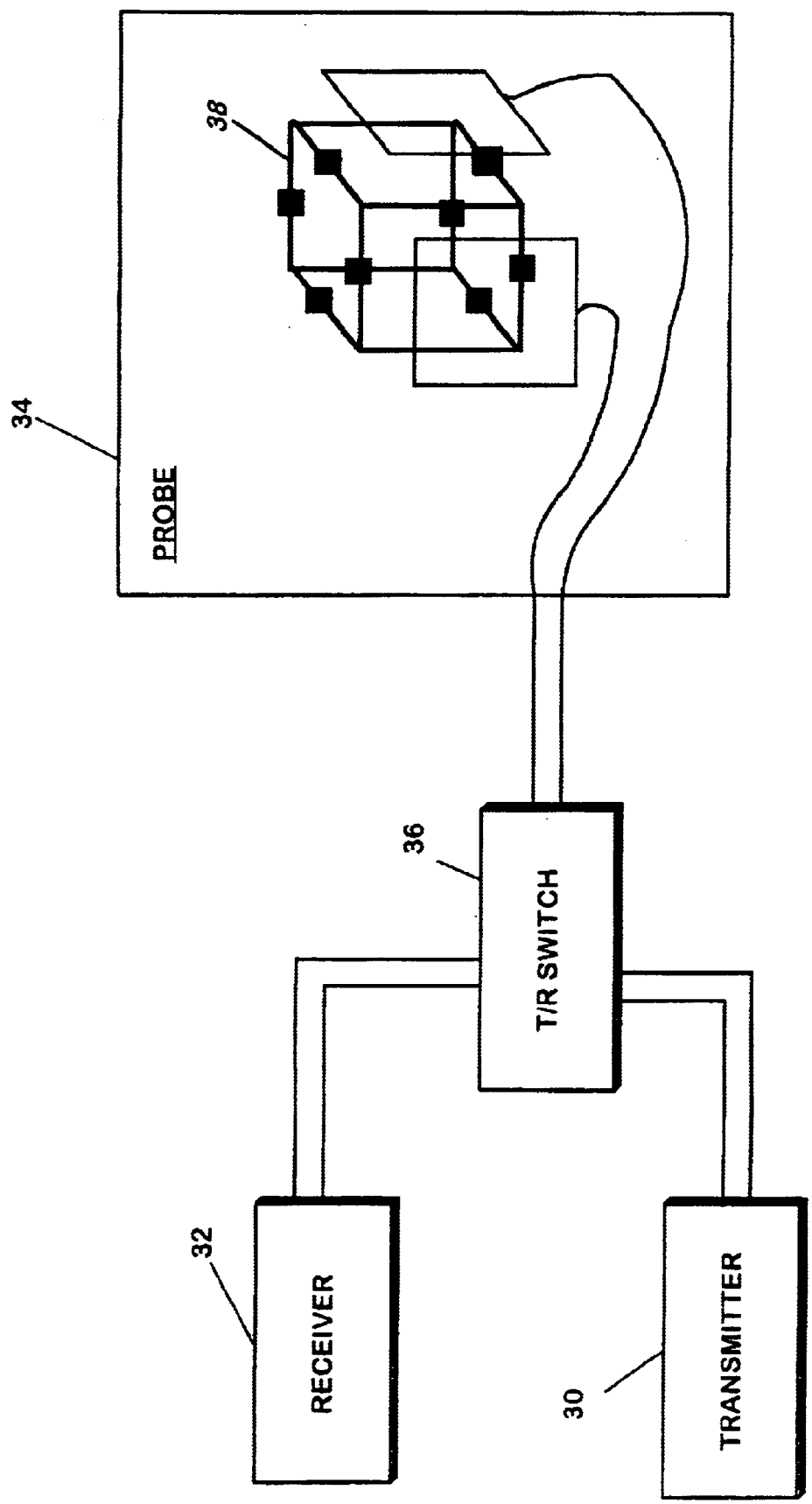
FIG. 2 is a schematic of an NQR apparatus for generating and detecting rotating RF magnetic fields.

Coil array 100 may be used with a system as shown in FIG. 2 wherein array 100 is substituted for coil 38 in probe 34. Coils 102 and 104 are preferably operated in parallel, where T/R switch 36 is composed of two independent T/R switches. Transmitter 30 may be two independent amplifiers driven by the same pulsed RF source, the input of one amplifier phase shifted by 90° from the other, and the outputs of the two amplifiers amplitude-matched.

Preferably, transmitter 30 uses a pulsed RF source to drive a single amplifier whose output passes through a quadrature hybrid that evenly splits the RF power into two parallel sources and phase shifts one by 90° from the other. Receiver 32 is composed of two separate phase- and gain-matched preamplifiers. The two signals can be detected separately and subsequently combined digitally, or they can be appropriated phase shifted and summed before detection. Alternatively, a time dependent phase shift can be applied to the signals before summation and detection. This allows the signals to be deconvolved and recombined digitally.

As described above in regard to FIG. 2, coils 102 and 104 are likewise energized when switch 36 connects probe 34 to transmitter 30 while disconnecting receiver 32. This occurs as transmitter 30 generates a pulse, e.g. an RF signal at a selected frequency corresponding to the resonance signal frequency of the target material nuclei, to probe 34, causing each coil 102 and 104 to store energy. Upon positioning probe 34 in proximity to a sample or other article, the stored RF energy causes a corresponding magnetic field to irradiate the sample or article. When a target material is present, the RF magnetic field induces an NQR signal in the target material. Upon the sample being irradiated with the RF magnetic field, switch 36 connects receiver 32 to probe 34 while disconnecting transmitter 30. Coils 102 and 104 then detect the NQR signal when the target material is present, and probe 34 emits a corresponding output signal that is then analyzed by receiver 32, confirming the presence of the target material.

Figure 3:
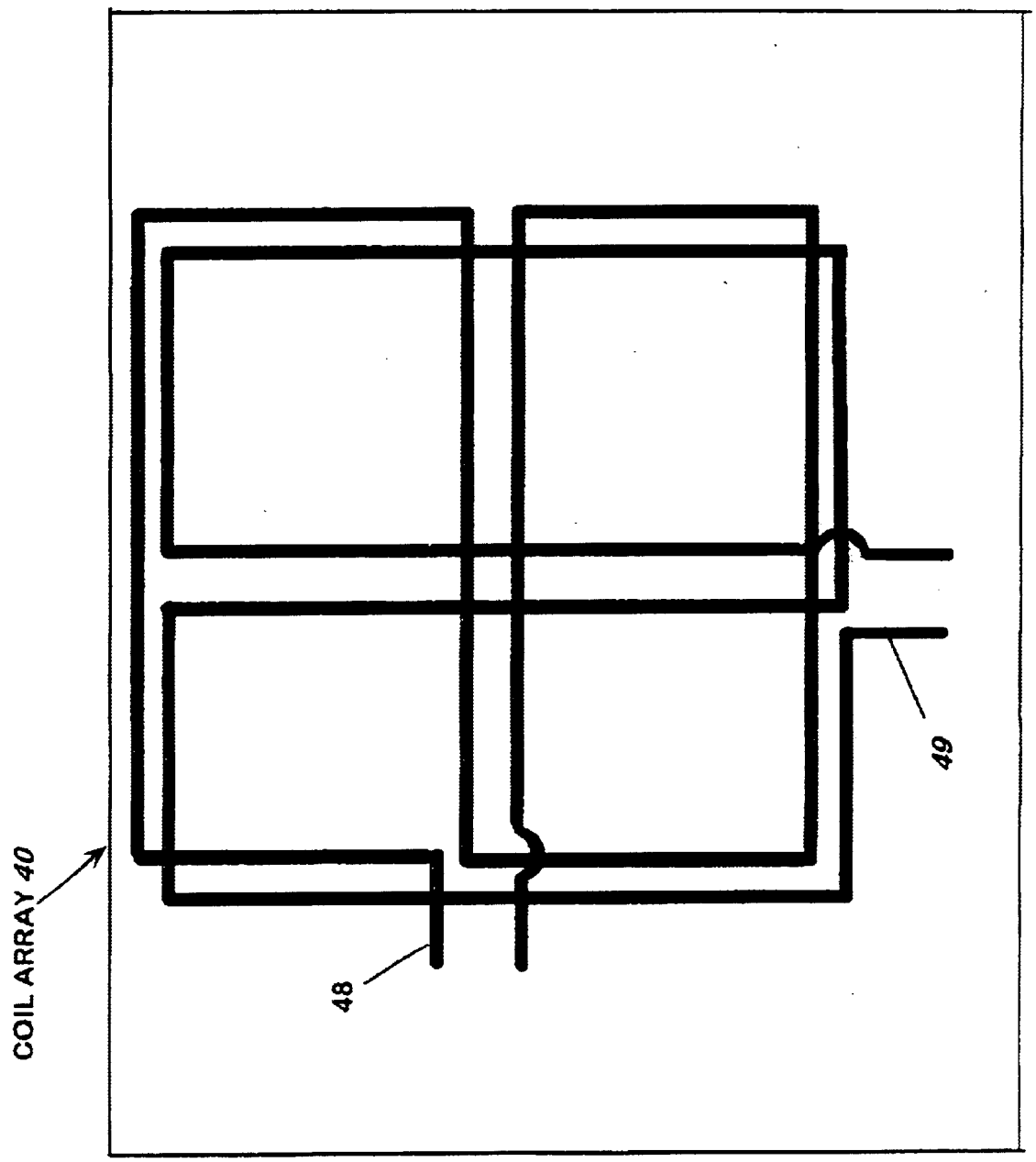
FIG. 3 is a schematic of a conventional surface coil array.
Figure 4:
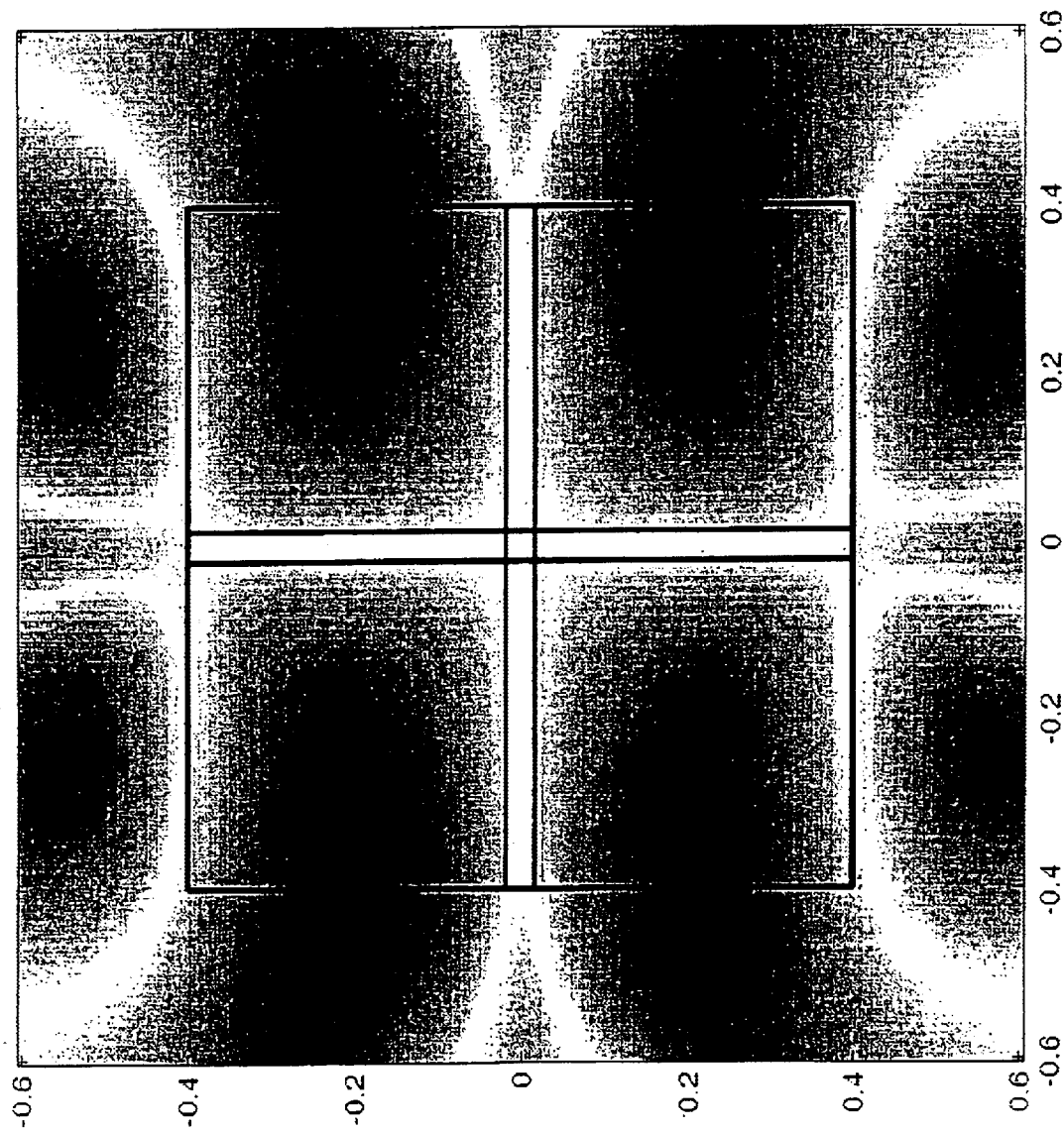
FIG. 4 is a figure depicting the orthogonality of the RF magnetic fields generated by the conventional surface coil array of FIG. 3.
Figure 6:
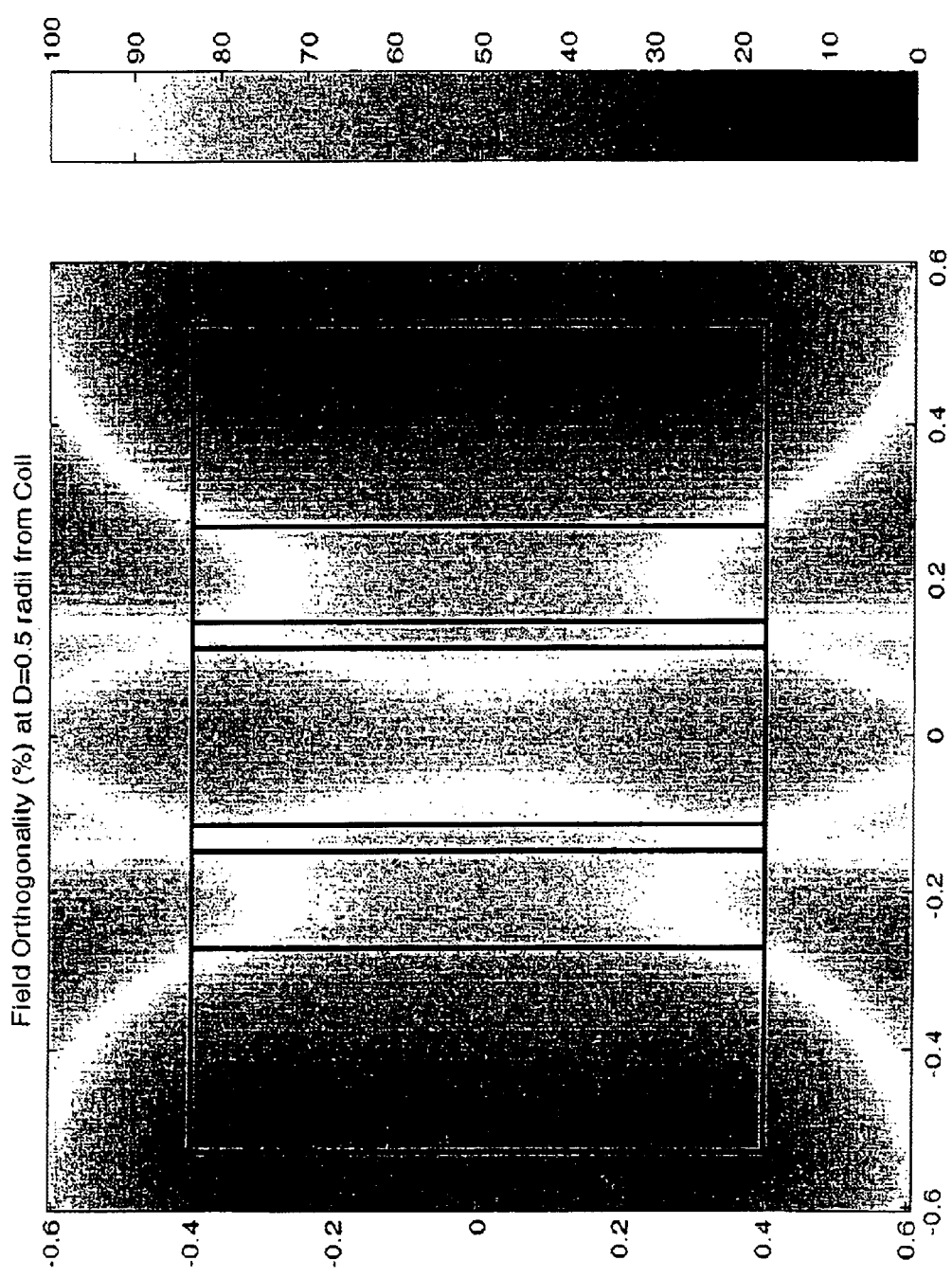
FIG. 6 is a figure depicting the orthogonality of the RF magnetic fields generated by the improved surface coil array of FIG. 5 according to the invention.

FIG. 6 shows the improved field orthogonality of the coil array 100 in comparison to coil array 40 (FIG. 3). The configuration of coil array 100 is as shown in FIG. 5, although as discussed above variations are possible. In order to detect quadrupolar nuclei, e.g. $^{14}N$, it is desirable that coils 102 and 104 produce an RF magnetic field that is confined as much as possible to the region of interest, i.e. the detecting region. The strength of the magnetic field drops off approximately as $1/r^3$ so that the effective RF magnetic field is confined to a region adjacent to the coil array 100 plane within a distance of about r.

Obviously many modifications and variations of the present invention are possible in the light of the above teachings. It is therefore to be understood that the scope of the invention should be determined by referring to the following appended claims.

We claim:

1. An NQR apparatus for irradiating a sample with an RF magnetic field and for determining the presence of a target material by detecting an NQR signal, comprising:
   a transmitter for generating an output signal at a selected frequency;
   a receiver for detecting the NQR signal;
   a probe;
   a switch coupling said receiver and said transmitter with said probe for alternately connecting and disconnecting said receiver and said transmitter to said probe, thereby switching said NQR apparatus between a transmitting mode and a receiving mode;
   wherein said probe comprises a resonant circuit including a coil array, and wherein said coil array comprises a first figure-8 coil and a partially overlapping, second figure-8 coil for generating an RF magnetic field in a detecting region outside said probe, and wherein said first and second coil are configured for alternating together between a transmitting mode for irradiating a sample in the detecting region with an RF magnetic field, and a receiving mode for detecting the NQR signal indicative of the presence of a target material in the sample.

2. An NQR apparatus as in claim 1, wherein said first and second coils are coplanar.

3. An NQR apparatus as in claim 1, wherein said first and second coils are rotated up to about 30 degrees with respect to each other.

4. An NQR apparatus as in claim 1, wherein said first and second coils overlap about 68 percent.

5. An NQR surface coil array, comprising:
   a first figure-8 coil and a substantially coplanar, partially overlapping, second figure-8 coil for generating an RF magnetic field in a detecting region outside said coils, and wherein said first and second coil are configured for alternating together between a transmitting mode for irradiating a sample in the detecting region with an RF magnetic field, and a receiving mode for detecting an NQR signal indicative of the presence of a target material in the sample.

6. An NQR surface coil array as in claim 5, wherein said first and second coils are coplanar.

7. An NQR surface coil array as in claim 5, wherein said first and second coils are rotated up to about 30 degrees with respect to each other.

8. An NQR surface coil array as in claim 5, wherein said first and second coils overlap about 68 percent.

9. A method for detecting a target material containing a quadrupole nuclei-containing substance, comprising:
   providing an NQR apparatus comprising:
      a transmitter for generating an output signal at a selected frequency;
      a receiver for detecting the NQR signal;
      a probe;
      a switch coupling said receiver and said transmitter with said probe for alternately connecting and disconnecting said receiver and said transmitter to said probe, thereby switching said NQR apparatus between a transmitting mode and a receiving mode;
      wherein said probe comprises a resonant circuit including a coil array, and wherein said coil array comprises a first figure-8 coil and a partially overlapping, second figure-8 coil for generating an RF magnetic field in a detecting region outside said probe, and wherein said first and second coil are configured for alternating together between a transmitting mode for irradiating a sample in the detecting region with an RF magnetic field, and a receiving mode for detecting the NQR signal indicative of the presence of a target material in the sample; and
   positioning the sample in the detecting region to determine the presence of the target material in the sample.

10. A method as in claim 9, wherein said first and second coils are coplanar.

11. A method as in claim 9, wherein said first and second coils are rotated up to about 30 degrees with respect to each other.

12. A method as in claim 9, wherein said first and second coils overlap about 68 percent.

13. An NQR apparatus for irradiating a sample with an RF magnetic field and for determining the presence of a target material by detecting an NQR signal, comprising:
   means for transmitting an output signal at a selected frequency;
   means for receiving and detecting the NQR signal;
   means for applying the output signal in a detecting region;

means for coupling said receiving means and said transmitting means with said signal applying means for switching said NQR apparatus between a transmitting mode and a receiving mode;

wherein said signal applying means comprises a resonant circuit including a coil array, and wherein said coil array comprises a first figure-8 coil and a partially overlapping, second figure-8 coil for generating an RF magnetic field in the detecting region outside said signal applying means, and wherein said first and second coil are configured for alternating together between a transmitting mode for irradiating a sample in the detecting region with an RF magnetic field, and a receiving mode for detecting the NQR signal indicative of the presence of a target material in the sample.

14. An NQR apparatus as in claim 13, wherein said first and second coils are coplanar.

15. An NQR apparatus as in claim 13, wherein said first and second coils are rotated up to about 30 degrees with respect to each other.

16. An NQR apparatus Os in claim 13, wherein said first and second coils overlap about 68 percent.

* * * * *